United States Patent [19]

Furukawa

[11] Patent Number: 4,997,057

[45] Date of Patent: Mar. 5, 1991

[54] METHOD AND APPARATUS OF EXPANDING ACOUSTIC REPRODUCTION RANGE

[75] Inventor: Kazunari Furukawa, Hamamatsu, Japan

[73] Assignee: Yamaha Corporation, Hamamatsu, Japan

[21] Appl. No.: 323,680

[22] Filed: Mar. 15, 1989

[30] Foreign Application Priority Data

Mar. 25, 1988 [JP] Japan .................................. 63-69762

[51] Int. Cl.[5] ......................... G10K 11/02; H05K 5/00

[52] U.S. Cl. .................................... 181/160; 181/156; 181/199; 381/28; 381/96; 381/159

[58] Field of Search ............... 181/141, 148, 155, 156, 181/160, 199; 381/28, 93, 94, 96, 98, 159, 89

[56] References Cited

U.S. PATENT DOCUMENTS

| | | | |
|---|---|---|---|
| 2,887,532 | 5/1959 | Werner | 381/96 |
| 3,037,081 | 5/1962 | Carlsson | 381/90 |
| 3,984,635 | 10/1976 | Nestorovic et al. | 381/89 |
| 4,118,600 | 10/1978 | Stahl | 381/98 |
| 4,126,204 | 11/1978 | Ogi et al. | 181/156 |
| 4,135,600 | 1/1979 | Ogi et al. | 181/156 |
| 4,180,706 | 12/1979 | Bakgaard | 381/96 |
| 4,741,040 | 4/1988 | Kaizer | 381/96 |

OTHER PUBLICATIONS

"Effect of a Negative Impedance Source on Loudspeaker Performance" by Richard E. Werner, The Journal of The Acoustical Society of America; vol. 29, No. 3, Mar. 1957.

"Application of Negative Impedance Amplifiers to Loudspeaker Systems", R. E. Werner and R. M. Carrell; Journal of the Audio Engineering Society; vol. 6, No. 4, Oct. 1958.

"A New Approach to Loudspeaker Damping", Warner Clements, Audio Engineering; Aug. 1951.

"Loudspeakers in Vented Boxes: Part I". A. N. Thiele, Journal of Audio Engineering Society, pp. 382–392, May 1971, vol. 19, No. 5.

"Loudspeakers in Vented Boxes: Part IL", A. N. Thiele, Journal of Audio Engineering Society, pp. 471–483, Jun. 1971, vol. 19, No. 6.

*Primary Examiner*—Benjamin R. Fuller

*Attorney, Agent, or Firm*—Spensley Horn Jubas & Lubitz

[57] ABSTRACT

An acoustic reproduction range expanding apparatus includes a closed or bass-reflex speaker system which has a low-frequency drive speaker and can reproduce a sound to a predetermined lowest frequeny. A port portion adapter consists of a mounting portion attached to an openng formed in a closed cabinet or a bass-reflex port of a bass-reflex cabinet, and a port portion. The port portion constitutes a Helmholtz's resonator together with the cabinet when the port portion is attached to the cabinet, and has a port shape so that a resonance frequency becomes lower than the lowest frequency. A drive portion adapter consists of an amplifier for driving the low-frequency drive speaker, and eliminates or invalidates an internal impedance inherent to the low-frequency drive speaker. The amplifier generates a negative impedance component in an output impedance.

6 Claims, 6 Drawing Sheets

METHOD AND APPARATUS OF EXPANDING ACOUSTIC REPRODUCTION RANGE

BACKGROUND OF THE INVENTION

1. Field of the Invention

The present invention relates to a method and apparatus which are applied to a conventional closed or bass-reflex speaker system to expand its reproduction range, particularly, to the low frequency side.

2. Description of the Prior Art

A conventional closed or bass-reflex speaker system has an inherent lowest reproduction frequency. This frequency is uniquely determined depending on the volume of a cabinet and characteristics ($f_O$, $Q_O$, and the like) of a speaker unit used, and cannot be changed, in particular, expanded.

For example, even if a speaker unit itself is replaced with one which can reproduce a sound to an extremely low frequency, a closed speaker system has a limitation determined by the volume of a cabinet. As to a bass-reflex speaker system, a cabinet and a unit are normally matching-designed to optimize a so-called phase inversion effect of a port. For this reason, if only a unit is replaced, the optimal matching state is disturbed, and a good result cannot be expected.

A resonance frequency $f_{OP}$ of a Helmholtz's resonator constituted by a cabinet and a bass-reflex port may be extremely decreased regardless of the basic concept of a bass-reflex speaker system. In this case, in a drive method using a conventional power amplifier, the Q value of the speaker unit is increased and the Q value of the resonator is decreased due to mutual dependency of the speaker unit and the resonator. Thus, a sufficient bass sound resonance radiation power of the resonator cannot be assured.

SUMMARY OF THE INVENTION

It is an object of the present invention to provide a method and apparatus which are applied to a closed or bass-reflex speaker system so as to easily expand a bass reproduction range.

In order to achieve the above object, according to the present invention, for a closed speaker system, an open port which constitutes a Helmholtz's resonator, a resonance frequency of which is lower than a lowest reproduction frequency inherent to the speaker system, together with a cabinet, is arranged. For a bass-reflex speaker system, the shape of its bass-reflex port is modified, so that a Helmholtz's resonance frequency determined by the bass-reflex port and the cabinet is decreased to be lower than a lowest reproduction frequency inherent to the speaker system. A low-frequency drive speaker unit of the modified speaker system is driven by an amplifier having a negative impedance component for equivalently eliminating or invalidating an internal impedance inherent to the speaker unit in an output impedance, and frequency characteristics of an input signal level of the amplifier are appropriately increased/decreased as needed.

With the above arrangement, the inherent internal impedance of the low-frequency drive speaker unit is equivalently eliminated or invalidated by a drive amplifier of the unit. When the inherent internal impedance is invalidated, the unit serves as an element which responds to only a drive signal input from the drive amplifier but does not essentially serve as a resonance system. For this reason, a diaphragm of the unit is substantially not influenced by an air reaction caused by an external force, in particular, an equivalent stiffness of a cabinet. The diaphragm serves as an equivalent wall when viewed from the cabinet. Thus, the presence of the diaphragm when viewed from the Helmholtz's resonator constituted by the cabinet and an open port or bass-reflex port can be invalidated. Therefore, the Q value of the Helmholtz's resonator does not depend on the impedance inherent to the speaker unit, and the resonance frequency can be maintained to be a sufficiently large value even when the Q value of a resonator is considerably decreased in a conventional drive method.

A port is provided to a closed speaker system, or the shape of a bass-reflex port of the bass-reflex speaker system is modified, so that a resonance frequency of a Helmholtz's resonator constituted by the cabinet and one of these ports is decreased and a resonance Q value is maintained to be a sufficiently large value so as to assure sufficient acoustic radiation power. Therefore, output sound pressure characteristics can be expanded to the bass sound side. Even if slight nonuniformity occurs in the output sound pressure characteristics, its level can be suppressed to a practical range which can be corrected by increasing/decreasing frequency characteristics of an input signal level of an amplifier for driving the speaker unit.

According to the present invention, a sound range of a closed or bass-reflex speaker system can be expanded by a simple operation to achieve bass sound reproduction with a sufficient sound pressure.

DETAILED DESCRIPTION OF THE PREFERRED EMBODIMENT

Figure 1A:
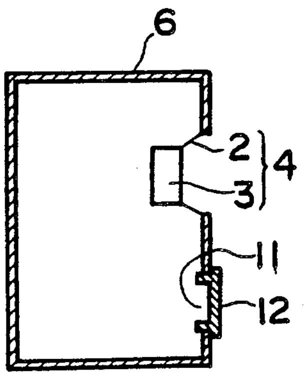
FIGS. 1A and 1B and FIGS. 2A and 2B are sectional views showing basic arrangements of acoustic apparatuses according to an embodiment of the present invention.

An embodiment of the present invention will now be described with reference to the accompanying drawings. In the drawings, the same reference numerals denote the common or corresponding components.

Figure 10:
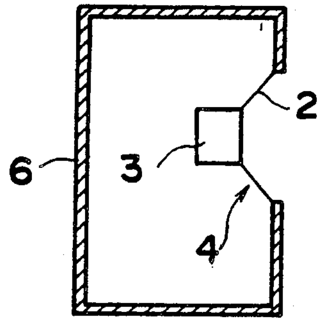
F I G. 10 (PRIOR ART)
FIG. 10 is a sectional view showing an arrangement of a conventional closed speaker system.

FIG. 10 is a sectional view of a conventional closed speaker system as one of the objects to which the present invention is applied. As shown in FIG. 10, a hole is formed in the front surface of a cabinet 6, and a vibrator 4 constituted by a diaphragm 2 and a dynamic speaker 3 is mounted in this hole.

A resonance frequency $f_{OC}$ of this closed speaker system is given by:

$$f_{OC}=f_O(1+S_C/S_O)^{\frac{1}{2}} \quad (1)$$

where $S_O$ is the equivalent stiffness of a vibration system, and $S_C$ is the equivalent stiffness of the cabinet 6.

A Q value $Q_{OC}$ of this speaker system is given by:

$$Q_{OC}=Q_O(1+S_C/S_O)^{\frac{1}{2}} \quad (2)$$

The frequency $f_{OC}$ serves as a standard of a bass sound reproduction limit of a uniform reproduction range, i.e., a lowest reproduction frequency. The Q value $Q_{OC}$ relates to a frequency characteristic curve around the resonance frequency $f_{OC}$. If the Q value $Q_{OC}$ is too large, the characteristic curve becomes too sharp around $f_{OC}$, and if it is too small, the curve becomes too moderate. In either case, the flatness of the frequency characteristics is impaired. The Q value $Q_{OC}$ is normally set to be about 0.8 to 1.

Figure 11:
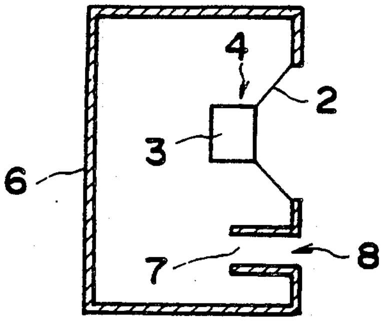
F I G. 11 (PRIOR ART)
FIG. 11 is a sectional view showing an arrangement of a conventional bass-reflex speaker system.

FIG. 11 is a sectional view showing a conventional phase-inversion (bass-reflex) speaker system as one of objects to which the present invention is applied. In the speaker system shown in FIG. 11, a hole is formed in the front surface of a cabinet 6, and a vibrator 4 constituted by a diaphragm 2 and a dynamic speaker 3 is mounted in the hole. An open duct port 8 having a sound path (bass-reflex port) 7 is arranged below the vibrator 4. The duct port 8 and the cabinet 6 form a Helmholtz's resonator. In this Helmholtz's resonator, an air resonance phenomenon occurs due to an air spring of the cabinet 6 as a closed cavity and an air mass in the bass-reflex port 7 of the duct port 8. A resonance frequency $f_{OP}$ is given by:

$$f_{OP}=c(S/lV)^{\frac{1}{2}}/2\pi \quad (3)$$

where c is the sonic speed, S is the sectional area of the bass-reflex port 7, l is the length of the bass-reflex port 7, and V is the volume of the cabinet 6.

Figure 12:
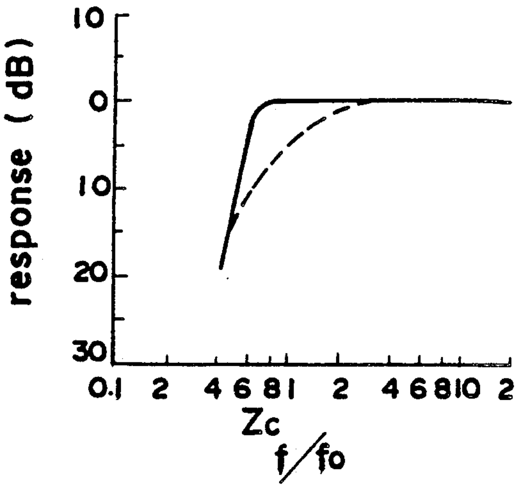
F I G. 12 (PRIOR ART)
FIG. 12 is a graph for explaining sound pressure characteristics of the speaker system shown in FIGS. 10 and 11.

An ideal bass-reflex speaker system is considered to have a Q value of a vibrator (speaker) of $Q_{OC}=1/\sqrt{3}$ and a resonance frequency $f_{OP}=f_{OC}/\sqrt{2}$. $Q_{OC}$ and $f_{OC}$ can be approximated by equations (1) and (2). A solid curve in FIG. 12 represents output sound pressure characteristics of an ideal bass-reflex speaker system wherein $Q_{OC}=0.58$ and $f_{OP}=0.71f_{OC}$. A broken curve in FIG. 12 represents output sound pressure characteristics obtained when the bass-reflex port of this speaker system is removed to constitute a closed speaker system.

Figure 1B:
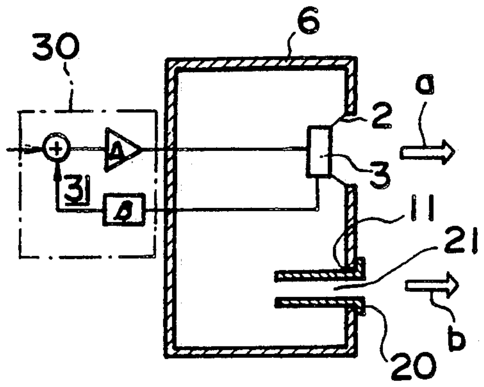

FIGS. 1A and 1B and FIGS. 2A and 2B show basic arrangements of acoustic apparatuses (speaker systems) according to an embodiment of the present invention. In the speaker system shown in FIG. 1A, an opening 11 is formed in the closed speaker system shown in FIG. 10, so that the present invention can be applied. In addition, a lid 12 is attached to the opening 11, so that this speaker system can be used as a closed type. FIG. 1B shows a state wherein the present invention is applied to the speaker system shown in FIG. 1A. The lid 12 is detached, and a port portion adapter 20 having a port portion 21 is inserted in the opening 11, and a converter 3 is connected to an output of a drive portion adapter 30 comprising a negative impedance portion 31 for equivalently generating a negative impedance component $(-Z_O)$ in an output impedance.

Figure 2A:
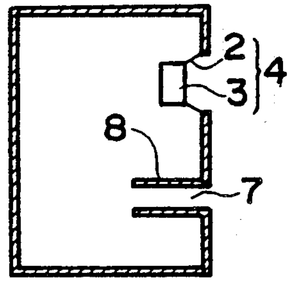
Figure 2B:
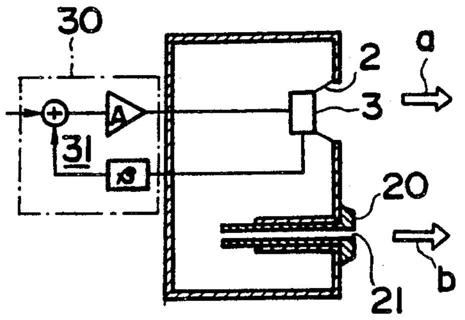

FIG. 2A shows the same bass-reflex speaker system as that shown in FIG. 11, and FIG. 2B shows a state wherein the present invention is applied to the speaker system shown in FIG. 2A. In this embodiment, a port portion adapter 20 having a port portion 21 which has a smaller diameter and a larger length than those of the bass-reflex port 7 is inserted in the port 7 to modify the port shape. In addition, a converter 3 is connected to the output of a drive portion adapter 30 as in FIGS. 1B.

Figure 3:
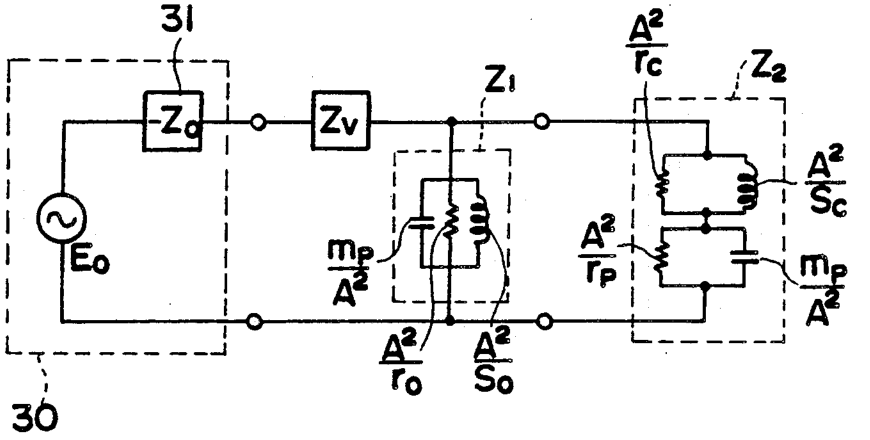
FIG. 3 is an electrical equivalent circuit diagram of the acoustic apparatuses shown in FIGS. 1A and 1B and FIGS. 2A and 2B.

Electrically equivalent circuit diagrams of FIGS. 1B and 2B are that shown in FIG. 3. A parallel resonance circuit $Z_1$ is formed by an equivalent motional impedance of a vibrator 4. In this circuit, reference symbol $r_O$ denotes an equivalent resistance of a vibration system; $S_O$, an equivalent stiffness of the vibration system; and $m_O$, an equivalent mass of the vibration system. A series resonance circuit $Z_2$ is formed by an equivalent motional impedance of a Helmholtz's resonator constituted by the port portion 21 and the cabinet 6. In this circuit, reference symbol $r_C$ denotes an equivalent resistance of the cavity of the resonator; $S_C$, an equivalent stiffness of the cavity; $r_P$, an equivalent resistance of the port portion 21; and $m_P$, an equivalent mass of the port portion 21. In FIG. 3, reference symbol A denotes a force coefficient. When the vibrator 4 comprises a dynamic direct radiation speaker, A=Bl where B is the magnetic flux density in a magnetic gap and l is the total length of a voice coil conductor. In FIG. 3, reference symbol $Z_V$ denotes an internal impedance of the converter 3. When the vibrator 4 comprises a dynamic direct radiation speaker, the impedance $Z_V$ mainly serves as a resistance of the voice coil, and includes a small inductance.

The operation of the acoustic apparatuses having the arrangements shown in FIGS. 1B and 2B will be described below.

When a drive signal is supplied from the drive portion adapter 30 having a negative impedance drive function to the converter 3 of the vibrator 4, the converter 3 electro-mechanically converts this signal to reciprocate the diaphragm 2 forward and backward (to the left and right in FIGS. 1B and 2B). The diaphragm 2 mechano-acoustically converts the reciprocal movement. Since the drive portion adapter 30 has the negative impedance drive function, the internal impedance inherent to the converter 3 is equivalently decreased (ideally, invalidated). Therefore, the converter 3 drives the diaphragm 2 while faithfully responding to the drive signal input to the drive portion adapter 30, and independently supplies drive energy to the Helmholtz's resonator constituted by the port portion 21 and the cabinet 6. In this case, the front surface side (right surface side in FIGS. 1B and 2B) serves as a direct radiation portion for directly externally radiating an acoustic wave, and the rear surface side (left surface side in FIGS. 1B and 2B) serves as a resonator drive portion for driving the Helmholtz's resonator constituted by the cabinet 6 and the port portion 21.

Figure 4:
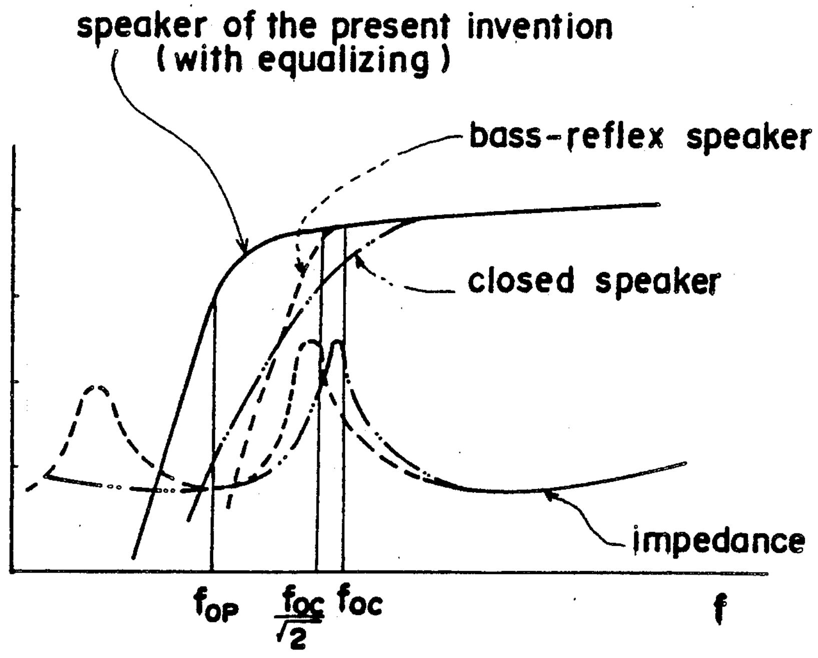
FIG. 4 is a graph showing frequency characteristics of sound pressures of acoustic waves radiated from the acoustic apparatuses shown in FIGS. 1A and 1B and FIGS. 2A and 2B.

For this reason, as indicated by an arrow a in FIGS. 1B and 2B, an acoustic wave is directly radiated from the diaphragm 2, and air in the cabinet 6 is resonated, so that an acoustic wave having a sufficient sound pressure is resonantly radiated from the resonance radiation portion (opening portion of the port portion 21), as indicated by an arrow b in FIGS. 1B and 2B. A sound pressure of an optimal level is assumed to be obtained from the opening portion such that the resonance frequency $f_{OP}$ is set to be lower than the Helmholtz's resonance frequency ($f_{OP}=f_{OC}/\sqrt{2}$) in the system shown in FIG. 2A by adjusting an air equivalent mass in the port portion 21 in the Helmholtz's resonator, and the Q value is set to be an optimal level by adjusting an equivalent resistance of the port portion 21. Under these conditions and by appropriately increasing/decreasing an input signal level, frequency characteristics of a sound pressure as represented by a solid curve in FIG. 4 can be obtained. In FIG. 4, alternate long and two short dashed curves represent frequency characteristics and impedance characteristics of the system shown in FIG. 1A, and broken curves represent frequency characteristics and impedance characteristics of the system shown in FIG. 2A.

An operation when the speaker system utilizing the Helmholtz's resonator is driven by a negative impedance will be described below.

Figure 5:
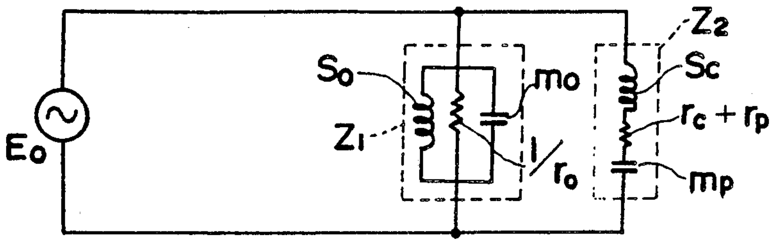
FIG. 5 is an equivalent circuit diagram when $Z_V - Z_O = 0$ in FIG. 4.

FIG. 5 shows an electrically equivalent circuit diagram when $Z_V-Z_O=0$, i.e., an internal impedance inherent to the converter 3 is equivalently completely invalidated. In FIG. 5, coefficients suffixed to values of respective components are omitted.

The equivalent circuit diagram reveals the following facts.

The two ends of the parallel resonance circuit $Z_1$ formed by the equivalent motional impedance of the vibrator 4 are short-circuited to a zero impedance in an AC manner. Therefore, the parallel resonance circuit $Z_1$ has a Q value = 0, and can no longer serve as a resonance circuit. More specifically, this vibrator 4 loses the concept of a lowest resonance frequency which is present in a state wherein the vibrator 4 is merely mounted on the Helmholtz's resonator. In the following description, the lowest resonance frequency $f_O$ or equivalent of the vibrator 4 merely means the essentially invalidated concept. In this manner, since the unit vibration system (parallel resonance circuit) $Z_1$ does not essentially serve as a resonance circuit, the resonance system in this acoustic apparatus is only the Helmholtz's resonance system (series resonance circuit) $Z_2$.

Since the converter 3 of the vibrator 4 does not essentially serve as the resonance circuit, it linearly responds to a drive signal input in real time, and faithfully electro-mechanically converts an electrical signal (drive signal $E_O$), thus displacing the diaphragm 2. That is, a perfect damped state (so-called "speaker dead" state) is achieved. The output sound pressure-frequency characteristics around the lowest resonance frequency $f_O$ or equivalent of this speaker in this state are 6 dB/oct. Contrary to this, characteristics of a normal voltage drive state are 12 dB/oct.

The series resonance circuit $Z_2$ formed by the equivalent motional impedance of the Helmholtz's resonator is connected to the drive signal source $E_O$ at a zero impedance. Thus, the circuit $Z_2$ no longer has a mutual dependency with the parallel resonance circuit $Z_1$. Thus, the parallel resonance circuit $Z_1$ and the series resonance circuit $Z_2$ are present independently of each other. Therefore, the volume ($1/S_C$) of the cabinet 6, and the shape and dimension ($m_P$) of the port portion 21 do not adversely influence the direct radiation characteristics of the vibrator 4. The resonance frequency and the Q value of the Helmholtz's resonator are not influenced by the equivalent motional impedance of the vibrator 4. More specifically, the characteristic values of the Helmholtz's resonator and the characteristic values of the vibrator 4 can be independently set. Furthermore, the series resistance of the series resonance circuit $Z_2$ is only $r_C+r_P$, and these resistances are sufficiently small values, as described above. Thus, the Q value of the series resonance circuit $Z_2$, i.e., the Helmholtz's resonator can be set to be sufficiently high.

From another point of view, since the unit vibration system does not essentially serve as a resonance system, it is displaced according to a drive signal input, and is not influenced by an external force, in particular, an air reaction caused by the equivalent stiffness $S_C$ of the cabinet. For this reason, the diaphragm 2 of the vibrator 4 equivalently serves as a wall when viewed from the cabinet side, and the presence of the vibrator 4 when viewed from the Helmholtz's resonator is invalidated. Therefore, the resonance frequency and the Q value of the Helmholtz's resonator do not depend on the impedance inherent to the vibrator 4. Even when the resonance frequency is set to be a value so that the Q value is considerably decreased in a conventional drive method, the Q value can be maintained to be a sufficiently large value. The Helmholtz's resonance system is present as a virtual speaker which performs acoustic radiation quite independently of the unit vibration system. Although the virtual speaker is realized by a small diameter corresponding to the port diameter, it corresponds to one having a considerably larger diameter as an actual speaker in view of its bass sound reproduction power.

The method and apparatus of the present invention described above will be compared with a conventional method wherein a bass-reflex speaker system shown in FIG. 11 is driven by a conventional power amplifier. In the conventional method, as is well known, a plurality of resonance systems, i.e., the unit vibration system $Z_1$ and the Helmholtz's resonance system $Z_2$, are present, and the resonance frequencies and the Q values of the resonance systems closely depend on each other. For example, if the port is elongated or its diameter is reduced ($m_P$ is increased) to decrease the resonance frequency of the Helmholtz's resonance system $Z_2$, the Q value is increased in the unit vibration system $Z_1$ and is decreased in the Helmholtz's resonance system $Z_2$. If the volume of the cabinet is decreased ($S_C$ is increased), the Q value and the resonance frequency are increased in the unit vibration system $Z_1$ and the Q value is further decreased in the Helmholtz's resonance system $Z_2$ even if the resonance frequency of the Helmholtz's resonance system $Z_2$ is kept constant by elongating the port or decreasing its diameter. More specifically, since the output sound pressure-frequency characteristics of the speaker system are closely related to the volume of the cabinet and the dimensions of the port, a high-grade design technique is required to match them. Thus, it is generally considered that easy expansion of an acoustic reproduction range is impossible. The relationship between the resonance frequency and a resonance acoustic radiation power in the Helmholtz's resonance system $Z_2$ is decreased at a rate of 12 dB/oct with respect to a decrease in frequency. When the resonance frequency is set to be extremely lower than that of the basic concept of the bass-reflex speaker system, correction by increasing/decreasing an input signal level is very difficult to achieve.

According to the present invention, as described above, since the speaker system utilizing Helmholtz's resonance is driven by a negative impedance, the characteristics, dimensions, and the like of the unit vibration system and the Helmholt resonance system can be independently set. In addition, even if the resonance frequency of the Helmholtz's resonance system is set to be low, the large Q value and the high bass sound reproduction power can be maintained, and the resonator drive power of the unit vibration system can be increased (6 dB/oct). Therefore, nonuniformity of the frequency characteristics can be advantageously corrected by increasing/decreasing an input signal level like in normal sound quality control. For this reason, an acoustic reproduction range, in particular, a bass sound range, can be easily expanded by modifying an existing speaker system.

In the above description, the case of $Z_V - Z_O = 0$ has been exemplified. However, the present invention includes a case of $Z_V - Z_O > 0$ if $-Z_O < 0$. In this case, the characteristic values and the like of the unit vibration system and the Helmholtz's resonance system become intermediate values between the case of $Z_V - Z_O = 0$ and the case of the conventional constant voltage drive method. Therefore, by positively utilizing this nature, the Q value of the Helmholtz's resonance system can be adjusted by adjusting the negative impedance $-Z_O$ instead of adjusting the port diameter or inserting a mechanical Q damper such as glass wool or felt in the cabinet.

Figure 6:
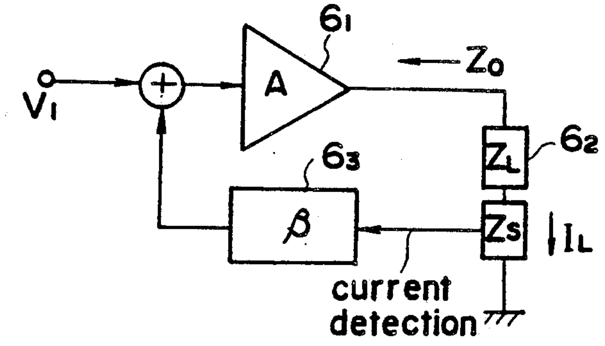
FIGS. 6/and 7 are basic circuit diagrams of circuits for generating a negative impedance.

FIG. 6 shows the basic arrangement of a negative impedance generator for driving the vibrator by a negative impedance.

In the circuit shown in FIG. 6, an output from an amplifier $6_1$ having a gain A is supplied to a load $Z_L$ of a speaker $6_2$. A current $I_L$ flowing through the load $Z_L$ is detected, and the detected current is positively fed back to the amplifier $6_1$ through a feedback circuit $6_3$ having a transmission gain $\beta$. Thus, the output impedance $Z_O$ of the circuit is given by:

$$Z_O - Z_S(1 - A\beta) \quad (4)$$

From equation (4), if $A\beta > 1$, $Z_O$ is an open stable type negative impedance. In equation (4), $Z_S$ is the impedance of a sensor for detecting the current.

Therefore, in the circuit shown in FIG. 6, the type of impedance $Z_S$ is appropriately selected, so that the output impedance can include a desired negative impedance component. For example, when the current $I_L$ is detected by a voltage across the two ends of the impedance $Z_S$, if the impedance $Z_S$ is a resistance $R_S$, the negative impedance component is a negative resistance component; if the impedance $Z_S$ is an inductance $L_S$, the negative impedance component is a negative inductance component; and if the impedance $Z_S$ is a capacitance $C_S$, the negative impedance component is a negative capacitance. An integrator is used as the feedback circuit $6_3$, and a voltage across the two ends of the inductance $L_S$ as the impedance $Z_S$ is detected by integration, so that the negative impedance component can be a negative resistance component. A differentiator is used as the feedback circuit $6_3$, and a voltage across the two ends of the capacitance $C_S$ as the impedance $L_S$ is detected by differentiation, so that the negative impedance component can be a negative resistance component. As the current detection sensor, a current probe such as a C.T. (current trans) or a Hall Element can be used in addition to these impedance elements $R_S$, $L_S$, and $C_S$.

An embodiment of the above-mentioned circuit is described in, e.g., Japanese Patent Publication No. Sho 59-51771.

Figure 7:
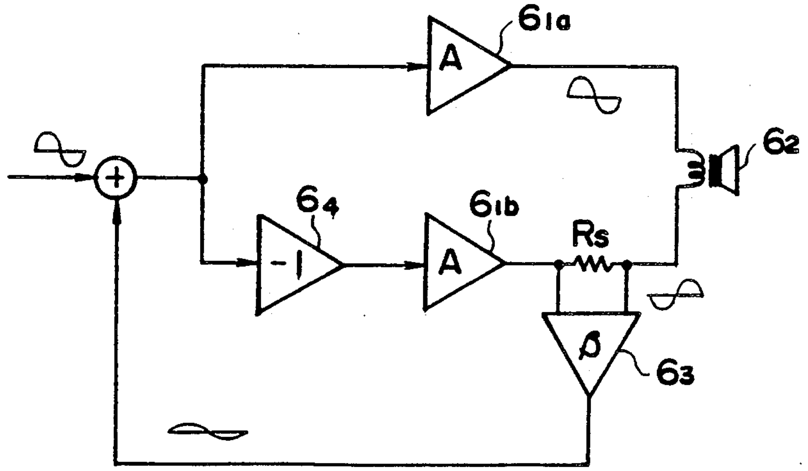

Current detection can be performed at a nonground side of the speaker $6_2$. An embodiment of such a circuit is described in, e.g., Japanese Patent Publication No. Sho 54-33704. FIG. 7 shows a BTL connection. This can be easily applied to the circuit shown in FIG. 6. In FIG. 7, reference numeral $6_4$ denotes an inverter.

Figure 8:
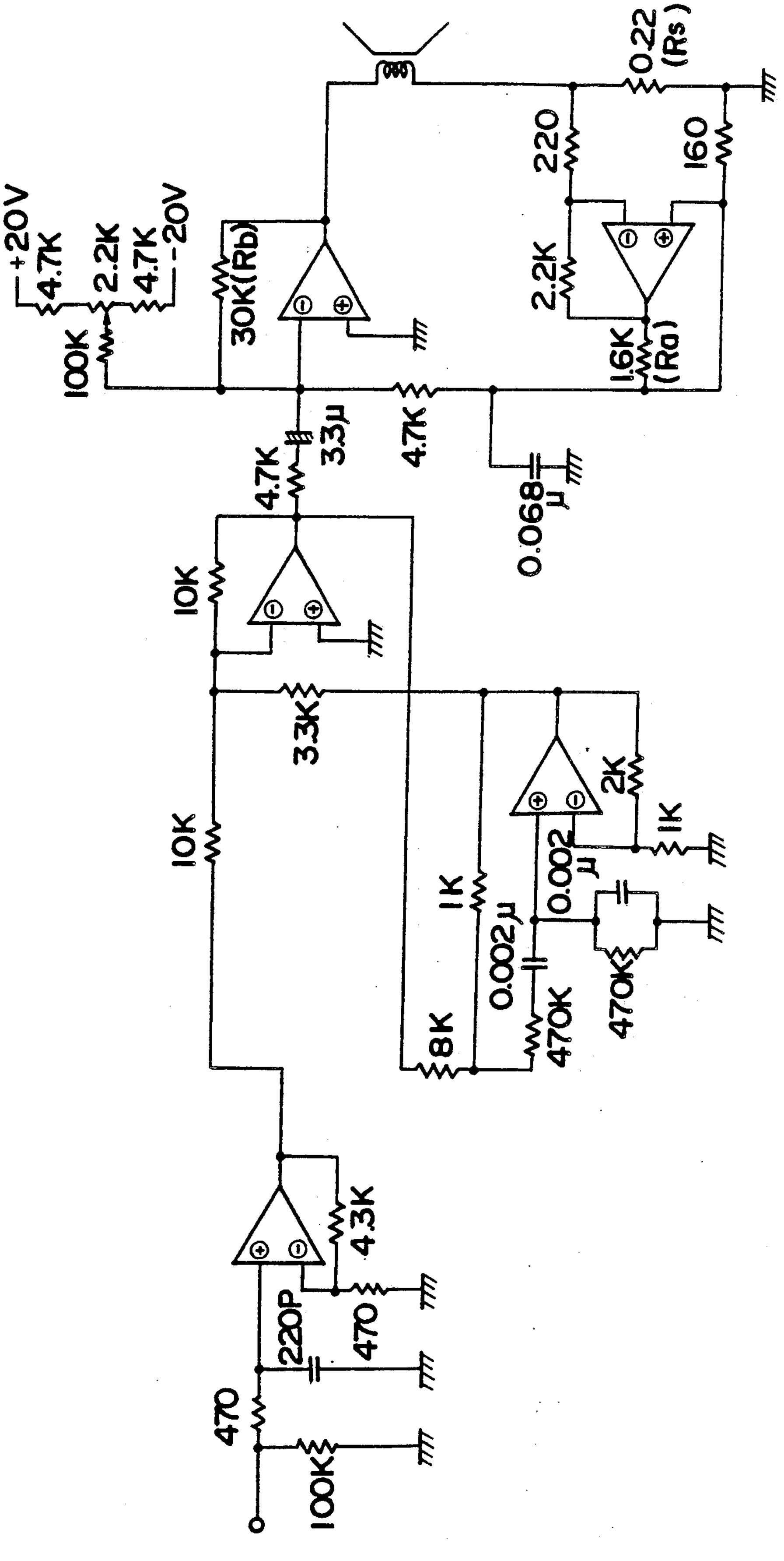
FIGS. 8 and 9 are detailed circuit diagrams of negative resistance drive adapters.
Figure 9:
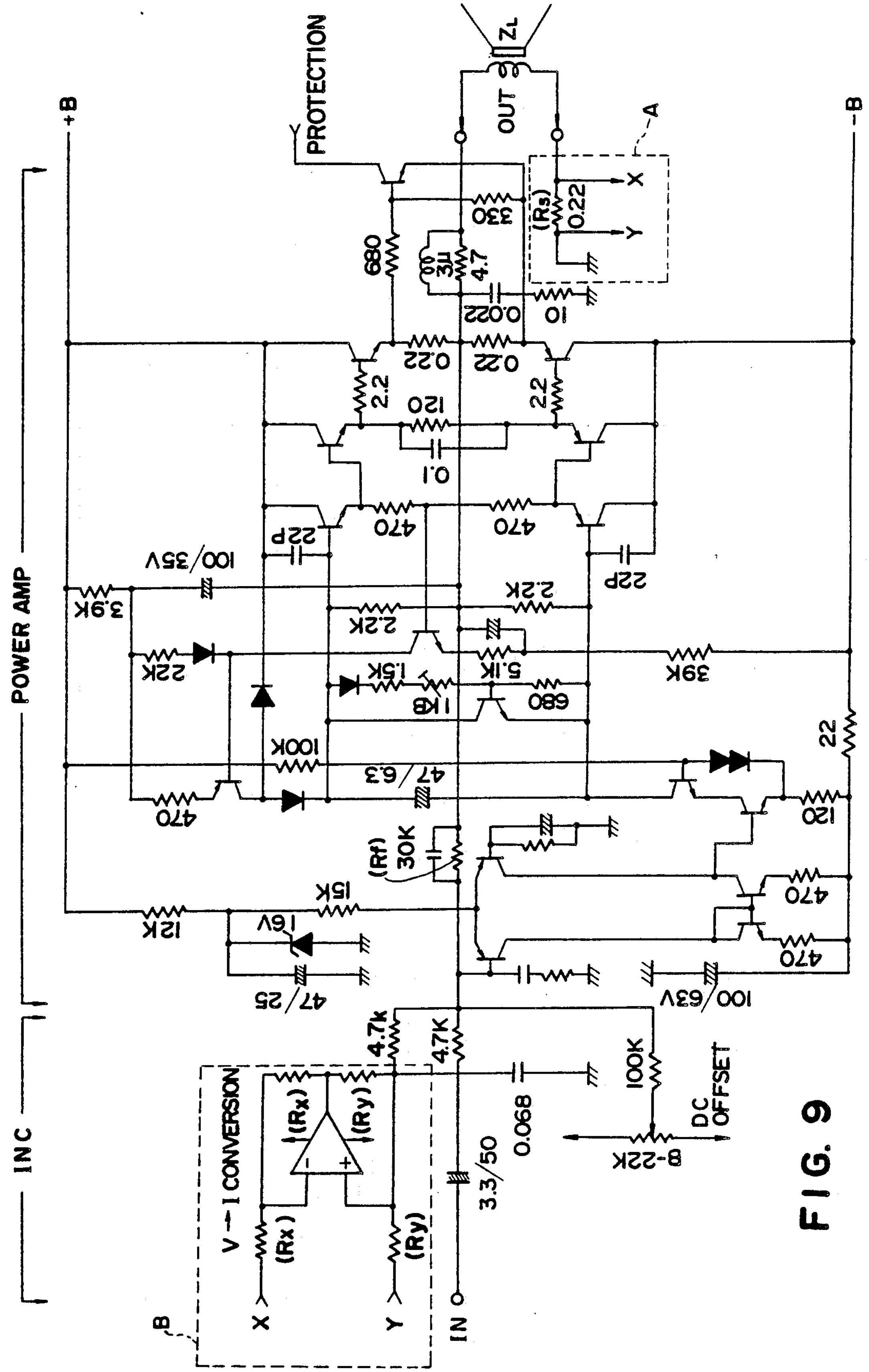

FIGS. 8 and 9 show detailed circuits of amplifiers which include a negative resistance component in an output impedance.

The output impedance $Z_O$ in the amplifier shown in FIG. 8 is given by:

$$\begin{aligned} Z_O &= R_S(1 - R_b/R_a) \\ &= 0.22(1 - 30/1.6) \\ &= -3.9\ (\Omega) \end{aligned}$$

The output impedance $Z_O$ in the amplifier shown in FIG. 9 is given by:

$$Z_O = R_S(1 - R_f/R_y)$$

In this case, since $R_f = 30$ kΩ, the output impedance $Z_O$ can equivalently include a negative resistance component when $R_y < 30$ kΩ.

What is claimed is:

1. An acoustic reproduction range expanding apparatus modified from a previously closed speaker system capable of reproducing sound to a predetermined lowest frequency, comprising:
   - a low frequency drive speaker;
   - a cabinet having an internal cavity defining a Helmholtz resonator, a first opening for mounting the drive speaker therein and a second opening formed in the cabinet;
   - a port portion adapter means, comprising a mounting portion attached to the second opening and a port portion extending from the mounting portion, with said port portion having a duct shape such that a Helmholtz resonator resonance frequency becomes lower than said predetermined lowest frequency of the previously closed speaker system; and
   - a drive portion adapter comprising an amplifier having an output impedance and providing an electrical signal to the drive speaker and having means for generating a negative impedance component in the output impedance so that the negative impedance component substantially counteracts an internal impedance inherent to said low frequency drive speaker, whereby a response characteristic of the Helmholtz resonator may be varied independently from the drive speaker.

2. An acoustic reproduction range expanding apparatus, comprising:
   - a bass-reflex speaker system that has a low frequency drive speaker and can reproduce sound to a predetermined lowest frequency;
   - a bass-reflex cabinet having an internal cavity defining a Helmholtz resonator, an opening formed therein for mounting the drive speaker therein and a bass-reflex opening;
   - a port portion adapter comprising a mounting portion attached to the bass-reflex cabinet at the bass-reflex opening and a port portion extending from the mounting portion, with said port portion having a duct shape such that a Helmholtz resonator resonance frequency becomes lower than said predetermined lowest frequency; and a drive portion adapter comprising an amplifier having an output impedance and providing an electrical signal to the drive speaker and having means for generating a negative impedance component in the output impedance so that the negative impedance component substantially counteracts an internal impedance inherent to said low frequency drive speaker, whereby a response characteristic of the Helmholtz resonator may be varied independently from the drive speaker.

3. A method for expanding a lowest reproduction frequency of a closed speaker system to a lower frequency side comprising the steps of:

forming an opening in a closed cabinet of a closed speaker system having a speaker unit and an internal cavity defining a Helmholtz resonator and inserting a port forming member in said opening such that a resonance frequency of the Helmholtz resonator, as determined by a volume of said cabinet and an open port shape after said port forming member is inserted, is lower than a lowest reproduction frequency of said closed speaker system; and coupling an amplifier which has a negative output impedance component to said speaker unit for substantially counteracting an internal impedance inherent to said speaker unit, whereby a response characteristic of the Helmholtz resonator can be varied independently from the speaker unit.

4. An acoustic reproduction range expanding method for expanding a lowest reproduction frequency of a bass-reflex speaker system which includes a bass-reflex cabinet having an internal cavity defining a Helmholtz resonator, a speaker unit and a bass-reflex portion, comprising the steps of:

inserting a port shape modifying member into the bass-reflex portion such that a resonance frequency of the Helmholtz resonator, as determined by a volume of said cabinet and a port shape after said port shape modifying means is inserted, decreases below a lowest reproduction frequency of said bass-reflex speaker;

coupling an amplifier which has a negative output impedance component to said speaker unit for substantially counteracting an internal impedance inherent to said speaker unit whereby a response characteristic of the Helmholtz resonator can be varied independently from the speaker unit.

5. An acoustic reproduction range expending apparatus modified from a closed speaker system that can reproduce sound down to a predetermined lowest frequency, comprising:

a cabinet having first and second openings and an internal cavity defining a Helmholtz resonator;

a drive speaker mounted in the first opening;

a port portion adapter having a mounting portion and a duct portion, whereby the mounting portion engages the second opening such that the duct portion extends inside the cabinet, and the Helmholtz resonator having a resonance frequency below the predetermined lowest frequency; and a drive portion adapter comprising an amplifier providing an electrical signal to the drive speaker and having means for generating a negative impedance component in an output impedance of the amplifier so that the negative impedance component substantially counteracts an internal impedance inherent to said drive speaker, whereby a response characteristic of the Helmholtz resonator may be varied independently from the drive speaker.

6. An acoustic reproduction range expanding apparatus modified from a bass-reflex speaker system that can reproduce sound down to a predetermined lowest frequency, comprising:

a cabinet having first and second openings and an internal cavity defining a Helmholtz resonator;

a drive speaker mounted in the first opening;

a port portion adapter having a mounting portion and a duct portion, whereby the mounting portion engages the second opening such that the duct portion extends inside the cabinet, and the Helmholtz resonator having a resonance frequency lower than the predetermined lowest frequency; and a drive portion adapter comprising an amplifier providing an electrical signal to the drive speaker and having means for generating a negative impedance component in an output impedance of the amplifier so that the negative impedance component substantially counteracts an internal impedance inherent to said drive speaker, whereby a response characteristic of the Helmholtz resonator may be varied independently from the drive speaker.

* * * * *